US010962621B2

(12) United States Patent
Kikuchi (10) Patent No.: US 10,962,621 B2
(45) Date of Patent: Mar. 30, 2021

(54) COMMUNICATION CIRCUIT, COMMUNICATION SYSTEM, AND SELF-DIAGNOSIS METHOD OF COMMUNICATION CIRCUIT

(71) Applicant: LAPIS Semiconductor Co., Ltd., Yokohama (JP)

(72) Inventor: Hidekazu Kikuchi, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 326 days.

(21) Appl. No.: 15/960,522

(22) Filed: Apr. 23, 2018

(65) Prior Publication Data

US 2018/0306886 A1    Oct. 25, 2018

(30) Foreign Application Priority Data

Apr. 25, 2017  (JP) .............................. JP2017-086129

(51) Int. Cl.
*G01R 35/00*    (2006.01)
*H04B 3/46*    (2015.01)
*G01R 31/396*    (2019.01)

(52) U.S. Cl.
CPC .............. *G01R 35/00* (2013.01); *H04B 3/46* (2013.01); *G01R 31/396* (2019.01)

(58) Field of Classification Search
CPC .............. G01R 31/31716; G01R 35/00; G01R 31/396; H04B 3/46; G08C 19/00; H04L 41/0631; H04L 41/0677
See application file for complete search history.

(56) References Cited

U.S. PATENT DOCUMENTS

| 4,271,513 A | * | 6/1981 | Maejima | ............... H04B 17/406 370/249 |
| 10,277,278 B2 | * | 4/2019 | Goswami | ............. H04B 5/0031 |
| 2004/0143780 A1 | * | 7/2004 | DiMambro | ............. H04L 43/50 714/716 |
| 2004/0174819 A1 | * | 9/2004 | Liu | ......................... H04L 43/50 370/244 |
| 2008/0195920 A1 | * | 8/2008 | Luce | ................ G01R 31/31716 714/798 |
| 2012/0275527 A1 | * | 11/2012 | Douglass | ............ H04L 25/0272 375/257 |
| 2015/0370312 A1 | * | 12/2015 | Desposito | ............. G06F 1/3206 713/323 |
| 2018/0359060 A1 | * | 12/2018 | Kim | ....................... H03M 9/00 |

FOREIGN PATENT DOCUMENTS

WO    2013175605    11/2013

* cited by examiner

*Primary Examiner* — Daniel R Miller
(74) *Attorney, Agent, or Firm* — JCIPRNET (57) ABSTRACT

A communication circuit, a communication system, and a self-diagnosis method of the communication circuit, which facilitate specifying a failed part which causes a communication failure when a communication failure occurs in a communication system, are provided. A serial signal for self-diagnosis is supplied to a first conversion unit, a pulse signal for self-diagnosis corresponding to the serial signal for self-diagnosis output from the first conversion unit is input to a second conversion unit instead of a pulse signal received by a pulse signal reception unit, and the serial signal corresponding to the pulse signal for self-diagnosis output from the second conversion unit is transmitted to the outside via a serial signal transmission unit.

20 Claims, 5 Drawing Sheets

COMMUNICATION CIRCUIT, COMMUNICATION SYSTEM, AND SELF-DIAGNOSIS METHOD OF COMMUNICATION CIRCUIT

CROSS-REFERENCE TO RELATED APPLICATION

This application claims the benefit of Japan Application no. 2017-086129, filed on Apr. 25, 2017. The entirety of the above-mentioned patent application is hereby incorporated by reference herein and made a part of this specification.

BACKGROUND

Technical Field

The disclosure relates to a communication circuit, a communication system, and a self-diagnosis method of a communication circuit.

Description of Related Art

The following technology is known as a technology for detecting a failure occurring in a system in a battery monitoring system that monitors a state of a plurality of battery cells.

For example, International Patent Application Laid-Open No. WO2013/175,605 (Patent Document 1) describes a battery control device including: a plurality of cell controllers that are provided corresponding to respective cell groups in which a plurality of single battery cells are connected, are mutually connected according to a predetermined communication order, and detect a state of each single battery cell in the corresponding cell groups; a control circuit that activates or stops the plurality of cell controllers, transmits a communication signal to the cell controller at a highest level in the communication order among the plurality of cell controllers, and receives a communication signal from a lowest level cell controller in the communication order among the plurality of cell controllers; and a first insulating element that is provided between the control circuit and the highest level cell controller. When a communication signal is transmitted from a control circuit or a cell controller one level higher in the communication order, each of the plurality of cell controllers is activated if the cell controller is stopped, or maintains an operating state if the cell controller is operating, and transfers the communication signal to the cell controller one level lower in the communication order or the control circuit, and the control circuit diagnoses an abnormal operation of the plurality of cell controllers according to whether or not the communication signal is received from the lowest level cell controller.

A battery monitoring system that monitors a state of each battery cell of an assembled battery includes, for example, a plurality of processing devices that measure, for example, a voltage of each battery cell, a control device that gives various commands including, for example, a command to read measurement data to the processing devices, a transmission path that connects the control device to the processing devices, and a communication circuit that is provided between the transmission path and the control device, and performs respective signal conversion processes on signals from the transmission path to the control device and signals from the control device to the transmission path.

In the battery monitoring system having the above-described configuration, when a failure occurs in communication that is performed between the plurality of processing devices and the control device, it may be difficult to specify a location of a failure that has caused the communication failure.

SUMMARY

An aspect of the present invention is to facilitate specifying a location of a failure which has caused a communication failure when the communication failure occurs in a communication system.

A communication circuit according to an embodiment of the present invention includes: a first reception unit that receives a first signal of a first signal format supplied from outside; a signal output unit that outputs a second signal in the first signal format used for self-diagnosis when the first signal includes a specific command; a first conversion unit to which any one of the first signal and the second signal is input, the first conversion unit converting the input signal into a signal of a second signal format different from the first signal format, and outputting the signal as a third signal; a first transmission unit that transmits the third signal to the outside; a second reception unit that receives a fourth signal of the second signal format supplied from the outside; a selection unit that selects the third signal from among the third signal and the fourth signal and outputs the third signal when the first signal includes the command, and selects the fourth signal from among the third signal and the fourth signal and outputs the fourth signal when the first signal does not include the command; a second conversion unit that converts the third signal or the fourth signal output from the selection unit into a signal of the first signal format and outputs the signal as a fifth signal; and a second transmission unit that transmits the fifth signal to the outside.

Another communication circuit according to an embodiment of the present invention includes: a first reception unit that receives a first signal of a first signal format supplied from outside; a first conversion unit that converts the first signal into a signal of a second signal format different from the first signal format, and outputs the signal as a second signal; a first transmission unit that transmits the second signal to the outside; a second reception unit that receives a third signal of the second signal format supplied from the outside; a selection unit that selects the second signal from among the second signal and the third signal and outputs the second signal when the first signal includes a specific command, and selects the third signal from among the second signal and the third signal and outputs the third signal when the first signal does not include the command; a second conversion unit that converts the second signal or the third signal output from the selection unit into a signal of the first signal format and outputs the signal as a fourth signal; a second transmission unit that transmits the fourth signal to the outside; and a comparison unit that compares the first signal with the fourth signal and outputs a comparison result.

A communication system according to an embodiment of the present invention includes any one of these communication circuits; and a processing device that is communicatively connected to the communication circuit, and performs a predetermined process based on a signal transmitted from the first transmission unit.

A communication system according to the present invention includes any one of the communication circuits; and a plurality of processing devices that performs a predetermined process based on a signal transmitted from the first transmission unit, wherein one of the plurality of processing devices is connected to the first transmission unit via a transmission path, another one of the plurality of processing devices is connected to the second reception unit via the transmission path, and each of the plurality of processing devices is communicatively connected to another processing device among the plurality of processing devices.

A self-diagnostic method of a communication circuit according to an embodiment of the present invention is a self-diagnosis method in a communication circuit including a first reception unit that receives a first signal of a first signal format supplied from outside, a first conversion unit that converts the first signal into a signal of a second signal format different from the first signal format and outputs the signal as a second signal, a first transmission unit that transmits the second signal to the outside, a second reception unit that receives a third signal of the second signal format supplied from the outside, a second conversion unit that converts the third signal into a signal of the first signal format and outputs the signal as a fourth signal, and a second transmission unit that transmits the fourth signal to the outside, the self-diagnosis method including: supplying a signal for self-diagnosis of the first signal format to the first conversion unit; inputting a signal for self-diagnosis converted into the second signal format output from the first conversion unit instead of the third signal to the second conversion unit; and transmitting a signal for self-diagnosis further converted into the first signal format output from the second conversion unit to the outside via the second transmission unit.

Another self-diagnostic method of a communication circuit according to an embodiment of the present invention is a self-diagnosis method in a communication circuit including a first reception unit that receives a first signal of a first signal format supplied from outside, a first conversion unit that converts the first signal into a signal of a second signal format different from the first signal format and outputs the signal as a second signal, a first transmission unit that transmits the second signal to the outside, a second reception unit that receives a third signal of the second signal format supplied from the outside, a second conversion unit that converts the third signal into a signal of the first signal format and outputs the signal as a fourth signal, and a second transmission unit that transmits the fourth signal to the outside, the self-diagnosis method including: inputting the second signal instead of the third signal to the second conversion unit; and comparing the signal output from the second conversion unit to which the second signal is input with the first signal.

According to embodiments of the present invention, when a communication failure occurs in the communication system, it is possible to facilitate specifying a location of a failure that has caused the communication failure.

DESCRIPTION OF THE EMBODIMENTS

Hereinafter, embodiments of the present invention will be described with reference to the drawings. In each of the drawings, substantially the same or equivalent components or portions are denoted by the same reference numerals.

First Embodiment

Figure 1:
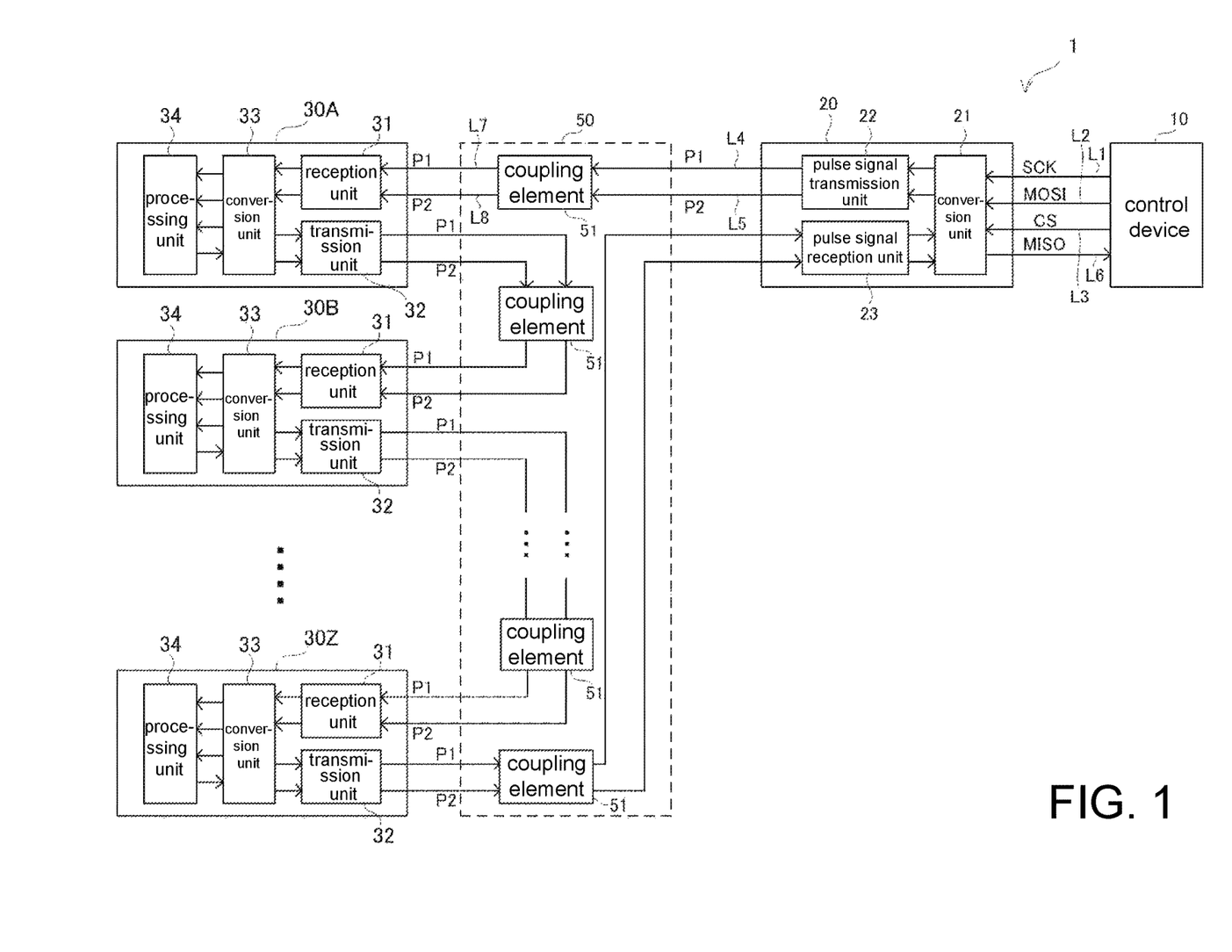
FIG. 1 is a block diagram illustrating a configuration of a communication system according to an embodiment of the present invention.

FIG. 1 is a block diagram illustrating a configuration of a communication system 1 according to an embodiment of the present invention. The communication system 1 includes a control device 10, a communication circuit 20, a plurality of processing devices 30A, 30B, . . . , 30Z, and a transmission path 50. The control device 10, the communication circuit 20, and the plurality of processing devices 30A, 30B, . . . , 30Z are formed in separate semiconductor chips, respectively, and are configured as separate semiconductor devices.

The control device 10 gives various commands to the processing devices 30A to 30Z using a serial peripheral interface (SPI) communication scheme which is one type of serial communication method. That is, the control device 10 functions as a master device in the SPI communication scheme, and the processing devices 30A to 30Z function as slave devices in the SPI communication scheme. The control device 10 is configured of a microcomputer including a central processing unit (CPU), a read only memory (ROM), a random access memory (RAM), and the like. The control device 10 gives various commands to the processing devices 30A to 30Z using a clock signal SCK, a data signal MOSI, and a chip select signal CS which are serial signals. The data signal MISO transmitted from the processing devices 30A to 30Z based on the command is received by the control device 10.

The clock signal SCK is a signal for controlling an operation timing of the processing devices 30A to 30Z. That is, the processing devices 30A to 30Z operate in synchronization with the clock signal SCK. The data signal MOSI includes commands for the processing devices 30A to 30Z. In a system including a plurality of processing devices 30A to 30Z, the data signal MOSI may include identification information such as an address or an ID corresponding to any one of the plurality of processing devices 30A to 30Z. The chip select signal CS is a signal for switching the processing devices 30A to 30Z to an active state or an inactive state through level shifting. In this embodiment, when the chip select signal CS is shifted to a low level, the processing devices 30A to 30Z are switched to the active state, and when the chip select signal CS is shifted to a high level, the processing devices 30A to 30Z are switched to the inactive state. The processing devices 30A to 30Z maintain the active state while the chip select signal CS exhibits the low level.

The clock signal SCK, the data signal MOSI, and the chip select signal CS output from the control device 10 are supplied to the communication circuit 20 through signal lines L1, L2 and L3, respectively. The data signal MISO is supplied to the control device 10 via the signal line L6.

The communication circuit 20 includes a conversion unit 21, a pulse signal transmission unit 22, and a pulse signal reception unit 23. The conversion unit 21 performs conversion into a pulse signal including a first pulse sequence P1 and a second pulse sequence P2 based on the clock signal SCK, the data signal MOSI, and the chip select signal CS input via the signal lines L1 to L3. The pulse signal transmission unit 22 transmits the first pulse sequence P1 to the signal line L4 and transmits the second pulse sequence P2 to the signal line L5. Thus, the clock signal SCK, the data signal MOSI, and the chip select signal CS output from the control device 10 are converted into the pulse signal including the first pulse sequence P1 and the second pulse sequence P2 and pass through the transmission path 50.

The transmission path 50 is a line for performing communication between the communication circuit 20 and the processing device 30A in a first stage, between the communication circuit 20 and the processing device 30Z in a last stage, and between processing devices adjacent to each other. The transmission path 50 includes coupling elements 51 for isolating communication sources from communication destinations, and a DC component of a signal passing through the transmission path 50 is removed by the coupling elements 51. As a coupling element 51, for example, a photocoupler, an isolator, a transformer, or a capacitor can be used. The first pulse sequence P1 sent out to the signal line L4 and the second pulse sequence P2 sent out to the signal line L5 are transferred to the signal line L7 and the signal line L8 via the coupling element 51, and supplied to the processing device 30A in the first stage.

Each of the processing devices 30A to 30Z includes a reception unit 31, a transmission unit 32, a conversion unit 33, and a processing unit 34. The reception unit 31 receives the first pulse sequence P1 and the second pulse sequence P2 input via the signal lines L7 and L8 and supplies the first pulse sequence P1 and the second pulse sequence P2 to the conversion unit 33.

The conversion unit 33 converts the first pulse sequence P1 and the second pulse sequence P2 into the original clock signal SCK, the original data signal MOSI, and the original chip select signal CS. That is, the conversion unit 33 performs a reverse conversion process of the conversion process performed in the conversion unit 21 of the communication circuit 20. The conversion unit 33 supplies the clock signal SCK, the data signal MOSI, and the chip select signal CS restored through the conversion process to the processing unit 34.

The processing unit 34 performs a predetermined process based on the clock signal SCK, the data signal MOSI, and the chip select signal CS supplied from the conversion unit 33. That is, the processing unit 34 enters an active state when the chip select signal CS is shifted to a low level, and performs a process according to a command included in the data signal MOSI in synchronization with the clock signal SCK.

In the plurality of processing devices, the transmission unit 32 of the processing device in the first stage is connected to the reception unit 31 of the processing device in the subsequent stage. That is, the plurality of processing devices are cascaded, the processing device 30A is the first stage, and the processing device 30Z is the last stage. The reception unit 31 of the processing device 30A in the first stage and the transmission unit 32 of the processing device 30Z in the last stage are connected to the communication circuit 20 via the transmission path 50. The signal transmitted from the communication circuit 20 is received by the reception unit 31 of the processing device 30A in the first stage via the coupling element 51 in the transmission path 50, and the signal transmitted from the transmission unit 32 of the processing device 30Z in the last stage is received by the pulse signal reception unit 23 of the communication circuit 20 via the coupling element 51 in the transmission path 50. Each processing device other than the processing device 30A in the first stage and the processing device 30Z in the last stage is connected to an adjacent processing device via the transmission path 50. For example, the signal transmitted from the transmission unit 32 of the processing device 30A is received by the reception unit 31 of the processing device 30B via the coupling element 51 in the transmission path 50.

Hereinafter, an example of the operation of the communication system 1 according to the embodiment will be described. The control device 10 designates any one of the plurality of processing devices 30A, 30B, . . . , 30Z and issues a command. That is, the control device 10 causes a command and identification information such as an address or an ID for designating a target for executing the command to be included in the data signal MOSI of the SPI signal, and supplies the data signal MOSI together with the clock signal SCK and the chip select signal CS to the communication circuit 20. The clock signal SCK, the data signal MOSI, and the chip select signal CS are supplied to the communication circuit 20, respectively.

The conversion unit 21 of the communication circuit 20 converts the clock signal SCK, the data signal MOSI, and the chip select signal CS received from the control device 10 into a pulse signal including the first pulse sequence P1 and the second pulse sequence P2. A known scheme can be used as the signal conversion scheme in the conversion unit 21. For example, a conversion scheme for representing data and timings indicated by the clock signal SCK, the data signal MOSI, and the chip select signal CS through a combination of a signal level of the first pulse sequence P1 and a signal level of the second pulse sequence P2 may be used. The pulse signal transmission unit 22 transmits the first pulse sequence P1 to the signal line L4 and the second pulse sequence P2 to the signal line L5 so as to supply the pulse signal obtained through the conversion process in the conversion unit 21 to the processing devices 30A to 30Z.

The first pulse sequence P1 and the second pulse sequence P2 output from the communication circuit 20 are received by the reception unit 31 of the processing device 30A in the first stage. The conversion unit 33 of the processing device 30A in the first stage converts the first pulse sequence P1 and the second pulse sequence P2 into the clock signal SCK, the data signal MOSI, and the chip select signal CS, and supplies each signal obtained through the conversion process to the processing unit 34 of the processing device 30A. When the identification information such as the address or the ID included in the data signal MOSI corresponds to the processing device 30A, the processing unit 34 of the processing device 30A executes a process according to the command included in the data signal MOSI. When the identification information included in the data signal MOSI does not correspond to the processing device 30A, the processing unit 34 of the processing device 30A does not execute the process according to the command included in the data signal MOSI. Further, the conversion unit 33 of the processing device 30A in the first stage supplies the first pulse sequence P1 and the second pulse sequence P2 to the transmission unit 32 of the processing device 30A without conversion. The transmission unit 32 of the processing device 30A transmits the first pulse sequence P1 and the second pulse sequence P2 to the adjacent processing device 30B in the subsequent stage.

The first pulse sequence P1 and the second pulse sequence P2 transmitted from the transmission unit 32 of the processing device 30A in the first stage are received by the reception unit 31 of the processing device 30B in the subsequent stage. The conversion unit 33 of the processing device 30B converts the first pulse sequence P1 and the second pulse sequence P2 into a clock signal SCK, a data signal MOSI, and a chip select signal CS, and transfers each signal obtained through the conversion process to the processing unit 34 of the processing device 30B. When the identification information included in the data signal MOSI corresponds to the processing unit 34 of the processing device 30B, the processing unit 34 of the processing device 30B executes a process corresponding to the command included in the data signal MOSI. When the identification information included in the data signal MOSI does not correspond to the processing unit 34 of the processing device 30B, the processing unit 34 of the processing device 30B does not execute the process corresponding to the command included in the data signal MOSI. Further, the conversion unit 33 of the processing device 30B supplies the first pulse sequence P1 and the second pulse sequence P2 to the transmission unit 32 of the processing device 30B without conversion. The transmission unit 32 of the processing device 30B transmits the first pulse sequence P1 and the second pulse sequence P2 to an adjacent processing device (not illustrated) in the subsequent stage.

Thus, the first pulse sequence P1 and the second pulse sequence P2 including the command issued from the control device 10 and the identification information for designating an execution target of the command are sequentially transferred from the processing device 30A in the first stage to the processing device 30Z in the last stage. The conversion unit 33 of each of the processing devices 30A to 30Z restores the pulse signal including the first pulse sequence P1 and the second pulse sequence P2 to the original SPI signal. In each of the processing devices 30A to 30Z, the processing unit 34 executes the command only when the identification information included in the data signal MOSI converted by the conversion unit 33 of the processing device corresponds to the processing device itself.

When the command issued from the control device 10 is, for example, data reading, the processing unit 34 of the processing device designated as a command execution target among the processing devices 30A to 30Z reads data according to the command, and supplies the read data (hereinafter referred to as read data) to the transmission unit 32 of the processing device. The transmission unit 32 of the processing device transmits the read data to the processing device in the subsequent stage. The read data is transmitted to the processing device 30Z in the last stage via the plurality of processing devices.

The processing device 30Z in the last stage transmits, from the transmission unit 32 of the processing device 30Z, the read data read by the processing unit 34 of the processing device 30Z or the read data transmitted from the processing device in a previous stage. The read data transmitted from the transmission unit 32 of the processing device 30Z in the last stage is sent in a format of a pulse signal including the first pulse sequence and the second pulse to the transmission path 50.

The read data transmitted from the transmission unit 32 of the processing device 30Z in the last stage is received by the pulse signal reception unit 23 of the communication circuit 20 via the transmission path 50. The conversion unit 21 of the communication circuit 20 converts the format of the received read data from the format of the pulse signal into a format of the SPI signal. The conversion unit 21 of the communication circuit 20 supplies the MISO signal including the read data generated through the conversion process to the control device 10.

Figure 2:
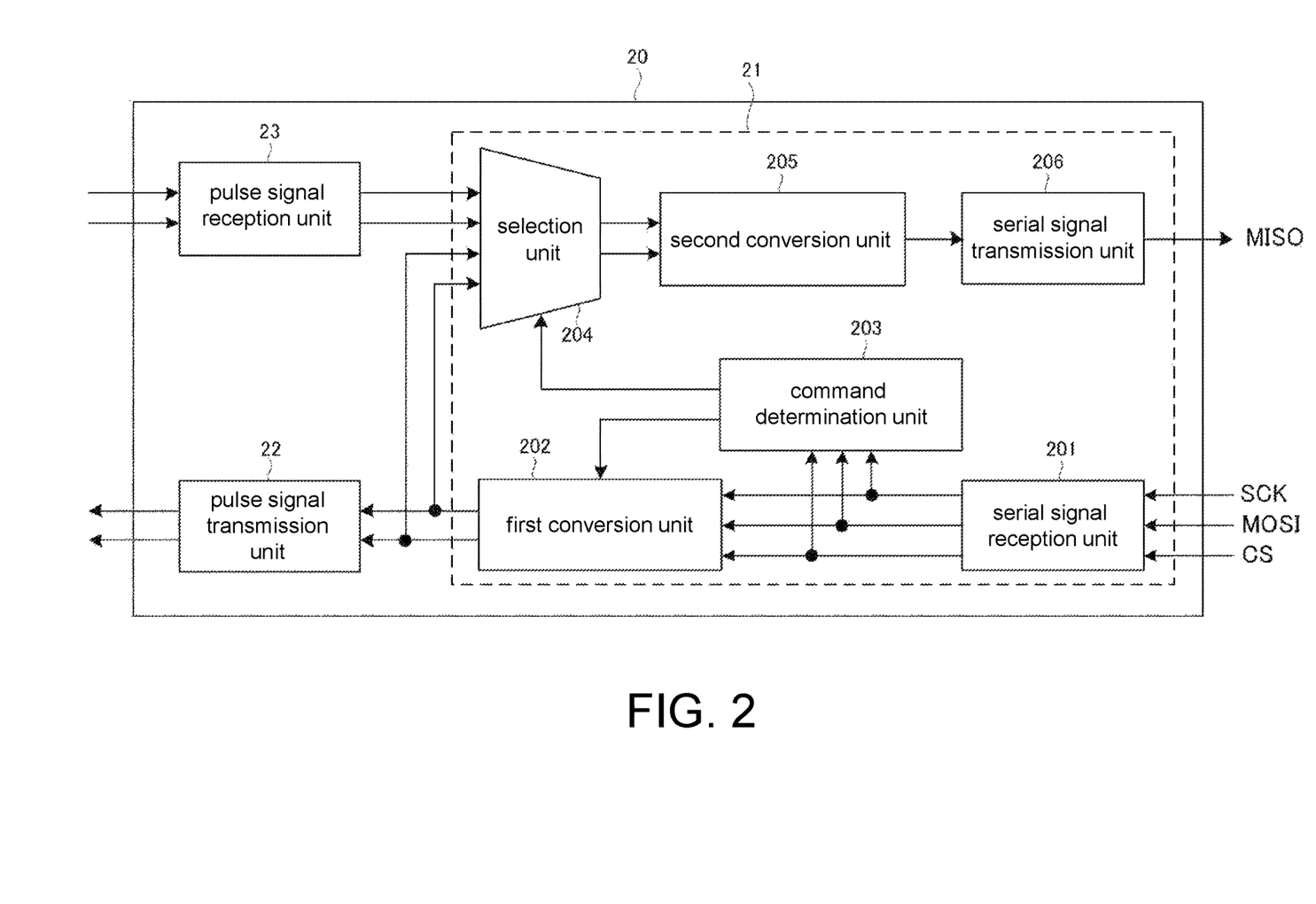
FIG. 2 is a block diagram illustrating a configuration of a communication circuit according to an embodiment of the present invention.

FIG. 2 is a block diagram illustrating a detailed configuration of the communication circuit 20. As described above, the communication circuit 20 includes a pulse signal transmission unit 22, a pulse signal reception unit 23, and a conversion unit 21. The conversion unit 21 includes a serial signal reception unit 201, a first conversion unit 202, a command determination unit 203, a selection unit 204, a second conversion unit 205, and a serial signal transmission unit 206.

The serial signal reception unit 201 receives the SPI signal (the clock signal SCK, the data signal MOSI, and the chip select signal CS) which is a serial signal output from the control device 10 (see FIG. 1) and supplies the received serial signal to the first conversion unit 202 and the command determination unit 203.

The first conversion unit 202 converts the serial signal supplied from the serial signal reception unit 201 into the pulse signal including the first pulse sequence and the second pulse sequence and outputs the pulse signal.

The pulse signal transmission unit 22 transmits the pulse signal output from the first conversion unit 202 to the processing device 30A in the first stage via the transmission path 50.

The pulse signal reception unit 23 receives the pulse signal including the first pulse sequence and the second pulse signal sequence that is output from the processing device 30Z in the last stage and input via the transmission path 50.

The pulse signal output from the first conversion unit 202 and the pulse signal output from the pulse signal reception unit 23 are input to the selection unit 204. The selection unit 204 selects one of the pulse signal output from the first conversion unit 202 and the pulse signal output from the pulse signal reception unit 23 based on a selection command supplied from the command determination unit 203, and outputs the selected pulse signal.

The second conversion unit 205 converts the pulse signal output from the selection unit 204 into a serial signal (MISO), and outputs the serial signal.

The serial signal transmission unit 206 transmits the serial signal output from the second conversion unit 205 to the control device 10 (see FIG. 1).

The command determination unit 203 determines whether or not the serial signal supplied from the serial signal reception unit 201 includes a command to perform self-diagnosis of the communication circuit 20. When the command determination unit 203 determines that the serial signal supplied from the serial signal reception unit 201 includes the command to perform self-diagnosis, the command determination unit 203 outputs the serial signal for self-diagnosis stored in a memory (not illustrated) included in the command determination unit 203, and supplies the serial signal to the first conversion unit 202. The command determination unit 203 is an example of a serial signal for self-diagnosis output unit in the embodiment of the present invention.

When the first conversion unit 202 receives the serial signal for self-diagnosis output from the command determination unit 203, the first conversion unit 202 converts the serial signal for self-diagnosis into the pulse signal including the first pulse sequence and the second pulse sequence, and outputs the serial signal.

Further, when the command determination unit 203 determines that the serial signal output from the serial signal reception unit 201 includes the command to perform self-diagnosis, the command determination unit 203 supplies a selection command to select the pulse signal output from the first conversion unit 202 to the selection unit 204. On the other hand, when the command determination unit 203 determines that the serial signal output from the serial signal reception unit 201 does not include the command to perform self-diagnosis, the command determination unit 203 supplies the selection command to select the pulse signal output from the pulse signal reception unit 23 to the selection unit 204.

Hereinafter, an operation of the communication circuit 20 will be described. The communication circuit 20 operates in a normal mode when the serial signal (an SPI signal) supplied from the control device 10 does not include the command to perform the self-diagnosis of the communication circuit 20, and operates in the self-diagnosis mode when the serial signal supplied from the control device 10 includes the command to perform the self-diagnosis of the communication circuit 20.

When the control device 10 causes the communication circuit 20 to operate in the normal mode, the control device 10 causes identification information such as an address or an ID corresponding to any one of the processing devices 30A to 30Z that are command execution targets to be included in the data signal MOSI of the serial signal (the SPI signal), and supplies the resultant serial signal to the communication circuit 20 together with the clock signal SCK and the chip select signal CS. On the other hand, when the control device 10 causes the communication circuit 20 to operate in the self-diagnosis mode, the control device 10 causes identification information such as an address or an ID not corresponding to any of the processing devices 30A to 30Z to be included in the data signal MOST of the serial signal (the SPI signal), and supplies the resultant serial signal to the communication circuit 20 together with the clock signal SCK and the chip select signal CS.

The control device 10, for example, may shift an operation mode of the communication circuit 20 to the self-diagnosis mode at predetermined intervals. Further, for example, when the control device 10 detects that a failure has occurred in communication that is performed between the processing devices 30A to 30Z and the control device 10, the control device 10 may shift the operation mode of the communication circuit 20 to the self-diagnosis mode. For example, when there is no response to a read command transmitted to the processing devices 30A to 30Z, and when data transmitted from the processing devices 30A to 30Z in response to the read command is abnormal, the control device 10 may determine that communication failure has occurred and shift the operation mode of the communication circuit 20 to the self-diagnosis mode.

The serial signal (the SPI signal) output from the control device 10 is received by the serial signal reception unit 201 of the communication circuit 20. Here, it is assumed that a read command for causing data reading to be performed by any one of the processing devices 30A to 30Z is included in the serial signal output from the control device 10. The serial signal reception unit 201 supplies the received serial signal to the command determination unit 203 and the first conversion unit 202.

The command determination unit 203 determines whether or not the serial signal includes a command to perform self-diagnosis of the communication circuit 20 by determining whether or not the serial signal supplied from the serial signal reception unit 201 includes identification information that does not correspond to any of the processing devices 30A to 30Z. When the serial signal supplied from the serial signal reception unit 201 includes identification information corresponding to any one of the processing devices 30A to 30Z, the command determination unit 203 determines that the serial signal does not include the command to perform self-diagnosis of the communication circuit 20. In this case, the operation mode of the communication circuit 20 is the normal mode. Hereinafter, the operation in the normal mode will be described.

In the normal mode, the command determination unit 203 does not output a serial signal for self-diagnosis. Further, in the normal mode, the command determination unit 203 supplies a selection command to select the pulse signal output from the pulse signal reception unit 23 to the selection unit 204.

The first conversion unit 202 converts the serial signal received by the serial signal reception unit 201 into the pulse signal including the first pulse sequence and the second pulse sequence and outputs the pulse signal. The pulse signal transmission unit 22 transmits the pulse signal output from the first conversion unit 202 to the processing device 30A in the first stage via the transmission path 50.

The pulse signal including the first pulse sequence and the second pulse sequence output from the processing device 30Z in the last stage according to the read command transmitted from the communication circuit 20 is received by the pulse signal reception unit 23. The pulse signal reception unit 23 supplies the received pulse signal to the selection unit 204.

The selection unit 204 selects the pulse signal supplied from the pulse signal reception unit 23, that is, the pulse signal output from the processing device 30Z in the last stage based on the selection command supplied from the command determination unit 203, and supplies the selected pulse signal to the second conversion unit 205.

The second conversion unit 205 converts the pulse signal from the processing device 30Z in the last stage supplied from the selection unit 204 into a serial signal (the SPI signal) and outputs the serial signal.

The serial signal transmission unit 206 transmits the serial signal (the SPI signal) output from the second conversion unit 205 to the control device 10. That is, the data read from the processing device in response to the read command issued from the control device 10 is supplied to the control device 10.

On the other hand, when the serial signal supplied from the serial signal reception unit 201 includes identification information that does not correspond to any of the processing devices 30A to 30Z, the command determination unit 203 determines that the serial signal includes the command to perform self-diagnosis of the communication circuit 20. In this case, the operation mode of the communication circuit 20 is the self-diagnosis mode. Hereinafter, an operation in the self-diagnosis mode will be described.

In the self-diagnosis mode, the command determination unit 203 reads the serial signal for self-diagnosis stored in a memory (not illustrated) included in the command determination unit 203, and supplies the serial signal for self-diagnosis to the first conversion unit 202. In the self-diagnosis mode, the command determination unit 203 supplies a selection command to select the pulse signal output from the first conversion unit 202 to the selection unit 204.

The first conversion unit 202 converts the serial signal for self-diagnosis supplied from the command determination unit 203 into the pulse signal including the first pulse sequence and the second pulse sequence, and outputs the pulse signal.

Note that the first conversion unit 202 may also perform a process of converting the serial signal including a command to perform self-diagnosis, which is supplied from the serial signal reception unit 201 before the serial signal for self-diagnosis is received, into the pulse signal. Further, the pulse signal transmission unit 22 may transmit the pulse signal corresponding to the serial signal including the pulse signal corresponding to the serial signal for self-diagnosis and the command to perform self-diagnosis, which is output from the first conversion unit 202, to the transmission path 50 or may stop the transmission. Since the serial signal including the command to perform self-diagnosis includes the identification information not corresponding to any of the processing devices 30A to 30Z, the pulse signal is ignored by the processing devices 30A to 30Z even when the pulse signal corresponding to the serial signal are received by the processing devices 30A to 30Z. On the other hand, when the pulse signal corresponding to the serial signal for self-diagnosis is sent to the transmission path 50, in one embodiment, the serial signal for self-diagnosis includes identification information such as an address or an ID not corresponding to any of the processing devices 30A to 30Z so that the processing devices 30A to 30Z do not malfunction due to the serial signal.

The selection unit 204 selects the pulse signal supplied from the first conversion unit 202, that is, the pulse signal corresponding to the serial signal for self-diagnosis based on the selection command supplied from the command determination unit 203, and supplies the selected pulse signal to the second conversion unit 205

The second conversion unit 205 converts the pulse signal corresponding to the serial signal for self-diagnosis supplied from the selection unit 204 into a serial signal and outputs the serial signal. That is, the pulse signal corresponding to the serial signal for self-diagnosis is restored to the original serial signal format (an SPI signal format) by the second conversion unit 205.

The serial signal transmission unit 206 transmits the serial signal for self-diagnosis restored to the serial signal format (the SPI signal format) by the second conversion unit 205 to the control device 10.

Thus, in the self-diagnosis mode, the serial signal for self-diagnosis is output from the command determination unit 203, the serial signal for self-diagnosis is temporarily converted into the pulse signal format by the first conversion unit 202, then returned to the serial signal format (the SPI signal format) in the second conversion unit 205, and sent to the control device 10 via the serial signal transmission unit 206.

The control device 10 holds an expected value of the serial signal for self-diagnosis. When the serial signal for self-diagnosis transmitted from the serial signal transmission unit 206 matches the expected value held by the control device 10, the control device 10 determines that there is no failure in the communication circuit 20. On the other hand, when the serial signal for self-diagnosis transmitted from the serial signal transmission unit 206 does not match the expected value held by the control device 10, the control device 10 determines that there is a failure in the communication circuit 20.

As described above, in the communication circuit 20 according to the embodiment, the communication circuit 20 can determine whether or not there is a failure in the serial signal reception unit 201, the first conversion unit 202, the second conversion unit 205, and the serial signal transmission unit 206, which perform primary functions of the communication circuit 20, by operating in the self-diagnosis mode. Therefore, when a failure occurs in the communication between the control device 10 and the processing devices 30A to 30Z, it is possible to identify whether or not the communication failure is caused by a failure inside the communication circuit 20 or is caused by a failure of the transmission path 50 or the processing devices 30A to 30Z. That is, when a communication failure occurs in the communication system 1, it is possible to facilitate specifying a location of failure that causes the communication failure.

Note that the command determination unit 203 may hold a plurality of serial signals for self-diagnosis having signal patterns different from each other. In this case, a command for selecting any one of the plurality of serial signals for self-diagnosis may be included in the serial signal output from the control device 10. When a plurality of addresses or IDs that do not correspond to any of the plurality of processing devices 30A to 30Z can be set, the plurality of addresses or IDs are used as a command for selecting the plurality of serial signals for self-diagnosis. Further, by performing the self-diagnosis of the communication circuit 20 a plurality of times using a plurality of different serial signals for self-diagnosis, it is possible to improve accuracy of failure detection of the communication circuit 20.

Second Embodiment

Figure 3:
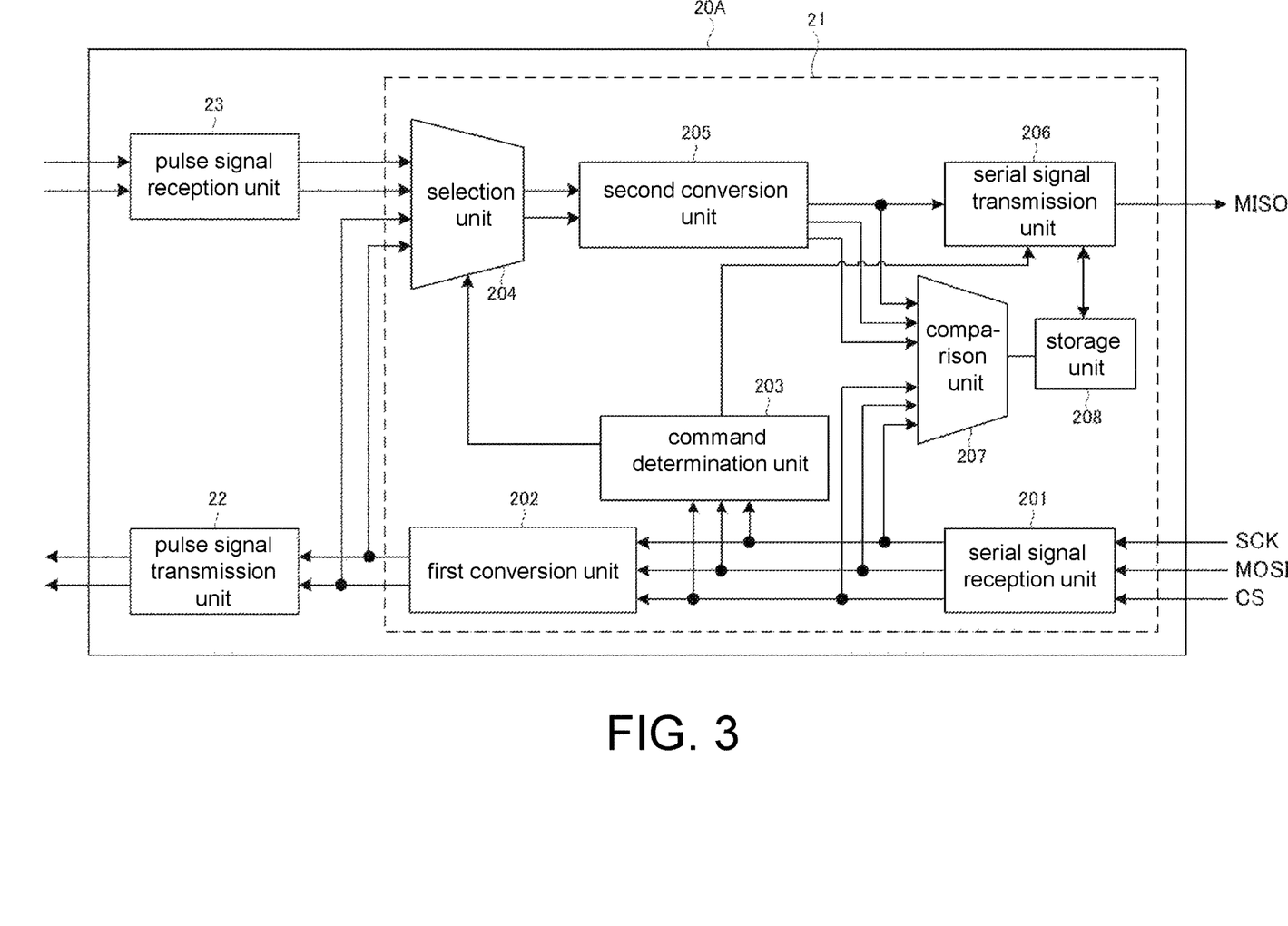
FIG. 3 is a block diagram illustrating a configuration of a communication circuit according to another embodiment of the present invention.

FIG. 3 is a block diagram illustrating a configuration of a communication circuit 20A according to a second embodiment of the present invention. The communication circuit 20A is different from the communication circuit 20 according to the first embodiment in that the communication circuit 20A further includes a comparison unit 207 and a storage unit 208. The configuration is otherwise the same as that of the communication circuit 20 according to the first embodiment. When the communication system is configured using the communication circuit 20A, the communication circuit 20 is replaced with the communication circuit 20A in the communication system 1 illustrated in FIG. 1.

A serial signal output from a serial signal reception unit 201 and a serial signal output from a second conversion unit 205 are input to a comparison unit 207. The comparison unit 207 compares the serial signal output from the serial signal reception unit 201 with the serial signal output from the second conversion unit 205 to determine whether or not signal patterns of the two match, and stores a determination result in the storage unit 208.

In the communication circuit 20A, when a command determination unit 203 determines that the serial signal supplied from the serial signal reception unit 201 includes a command to perform self-diagnosis of the communication circuit 20A, the command determination unit 203 supplies a selection command to select the pulse signal output from the first conversion unit 202 to the selection unit 204. Further, when the command determination unit 203 determines that the serial signal supplied from the serial signal reception unit 201 includes a command to perform self-diagnosis of the communication circuit 20A, the command determination unit 203 transmits, to the serial signal transmission unit 206, a control signal to inhibit transmission of the serial signal to the control device 10.

On the other hand, when the command determination unit 203 determines that the serial signal output from the serial signal reception unit 201 does not include the command to perform the self-diagnosis of the communication circuit 20A, the command determination unit 203 supplies a selection command to select the pulse signal output from the pulse signal reception unit 23 to the selection unit 204.

Hereinafter, an operation of the communication circuit 20A will be described. The serial signal (the SPI signal) output from the control device 10 is received by the serial signal reception unit 201 of the communication circuit 20A. Here, it is assumed that the serial signal includes a write command to write data to any one of the processing devices 30A to 30Z.

The serial signal reception unit 201 supplies the received serial signal to the command determination unit 203, the first conversion unit 202, and the comparison unit 207.

The command determination unit 203 determines whether or not the serial signal supplied from the serial signal reception unit 201 includes identification information that does not correspond to any of the processing devices 30A to 30Z to determine whether or not the serial signal includes a command to perform self-diagnosis of the communication circuit 20A.

When the serial signal supplied from the serial signal reception unit 201 includes the identification information corresponding to any one of the processing devices 30A to 30Z, the command determination unit 203 determines that the serial signal does not include a command to perform the self-diagnosis of the communication circuit 20A. In this case, an operation mode of the communication circuit 20A is a normal mode. Hereinafter, the operation in the normal mode will be described.

In the normal mode, the command determination unit 203 supplies a selection command to the selection unit 204 to select the pulse signal output from the pulse signal reception unit 23.

The first conversion unit 202 converts the serial signal received by the serial signal reception unit 201 into the pulse signal including the first pulse sequence and the second pulse sequence and outputs the pulse signal. The pulse signal transmission unit 22 transmits the pulse signal output from the first conversion unit 202 to the processing device 30A in the first stage via the transmission path 50. Since the command included in the pulse signal transmitted from the pulse signal transmission unit 22 is the write command, no data is transmitted from the processing devices 30A to 30Z in response to the write command.

On the other hand, when the serial signal supplied from the serial signal reception unit 201 includes identification information that does not correspond to any of the processing devices 30A to 30Z, the command determination unit 203 determines that the serial signal includes the command to perform self-diagnosis of the communication circuit 20A. In this case, the operation mode of the communication circuit 20A is the self-diagnosis mode. Hereinafter, an operation in the self-diagnosis mode will be described.

In the self-diagnosis mode, the command determination unit 203 supplies a selection command to select the pulse signal output from the first conversion unit 202 to the selection unit 204. Further, in the self-diagnosis mode, the command determination unit 203 supplies a control signal for inhibiting the transmission of the serial signal to the control device 10 to the serial signal transmission unit 206.

The first conversion unit 202 converts the serial signal supplied from the serial signal reception unit 201 into the pulse signal including the first pulse sequence and the second pulse sequence and outputs the pulse signal.

The selection unit 204 selects the pulse signal supplied from the first conversion unit 202 based on the selection command supplied from the command determination unit 203 and supplies the selected pulse signal to the second conversion unit 205.

The second conversion unit 205 converts the pulse signal supplied from the selection unit 204 into a serial signal and outputs the serial signal. That is, the pulse signal corresponding to the serial signal received by the serial signal reception unit 201 is restored to an original serial signal format. The serial signal output from the second conversion unit 205 is supplied to the comparison unit 207 and the serial signal transmission unit 206.

The comparison unit 207 compares the serial signal supplied from the second conversion unit 205 with the serial signal supplied from the serial signal reception unit 201 to determine whether or not signal patterns of the two match with each other, and stores a determination result in the storage unit 208.

The serial signal transmission unit 206 stops transmission of the serial signal supplied from the second conversion unit 205 to the control device 10 based on the control signal for inhibiting signal transmission to the control device 10, which is supplied from the command determination unit 203. When the command included in the serial signal output from the control device 10 is a write command, data transmission to the control device 10 based on the write command is not assumed. Therefore, when the communication circuit 20A operates in the self-diagnosis mode, it is desirable to inhibit the signal transmission to the control device 10.

As described above, in the self-diagnosis mode, the serial signal output from the second conversion unit 205 (that is, a serial signal generated by passing through the serial signal reception unit 201, the first conversion unit 202, and the second conversion unit 205) and the serial signal output from the serial signal reception unit 201 (that is, the serial signal not passing through the first conversion unit 202 and the second conversion unit 205) are compared with each other by the comparison unit 207, and it is determined whether or not the signal patterns of the two match each other. Since both signals are signals based on the same serial signal supplied from the control device 10, it can be determined that there is no failure in the serial signal reception unit 201, the first conversion unit 202, and the second conversion unit 205 when the patterns of both signals match each other. On the other hand, when the two signals do not match each other, it can be determined that there is a failure in the serial signal reception unit 201, the first conversion unit 202, or the second conversion unit 205. That is, the result of the determination as to whether there is a failure in the communication circuit 20A is output from the comparison unit 207 and stored in the storage unit 208.

After the self-diagnosis has ended in the communication circuit 20A, the control device 10 outputs a serial signal including a command to read the data stored in the storage unit 208. When the command determination unit 203 determines that the serial signal received by the serial signal reception unit 201 includes a command to read the data stored in the storage unit 208, the command determination unit 203 supplies a control signal to read data from the storage unit 208 to the serial signal transmission unit 206. When the serial signal transmission unit 206 receives such a control signal, the serial signal transmission unit 206 reads the data from the storage unit 208 and transmits the read data, that is, the result of the determination as to whether there is a failure in the communication circuit 20A to the control device 10.

As described above, in the communication circuit 20A according to the embodiment, the communication circuit 20A can determine whether or not there is a failure in the serial signal reception unit 201, the first conversion unit 202, and the second conversion unit 205, which perform primary functions of the communication circuit 20A, by operating in the self-diagnosis mode. Therefore, when a failure occurs in the communication between the control device 10 and the processing devices 30A to 30Z, it is possible to identify whether or not the communication failure is caused by a failure inside the communication circuit 20A or is caused by a failure of the transmission path 50 or the processing devices 30A to 30Z. That is, when the communication failure occurs in the communication system, it is possible to facilitate specifying a location of failure that causes the communication failure.

Further, according to the communication circuit 20A of the embodiment, since failure detection of the communication circuit 20A can be performed using an arbitrary serial signal supplied from the control device 10, it is possible to use a plurality of serial signals having different signal patterns for failure detection and to improve accuracy of the failure detection.

Note that although the case in which the comparison result in the comparison unit 207 is stored in the storage unit 208 has been illustrated in the embodiment, the comparison result in the comparison unit 207 may be transmitted to the control device 10 via the serial signal transmission unit 206 or may be transmitted directly from the comparison unit 207 to the control device 10. In this case, the storage unit 208 can be omitted.

Third Embodiment

Figure 4:
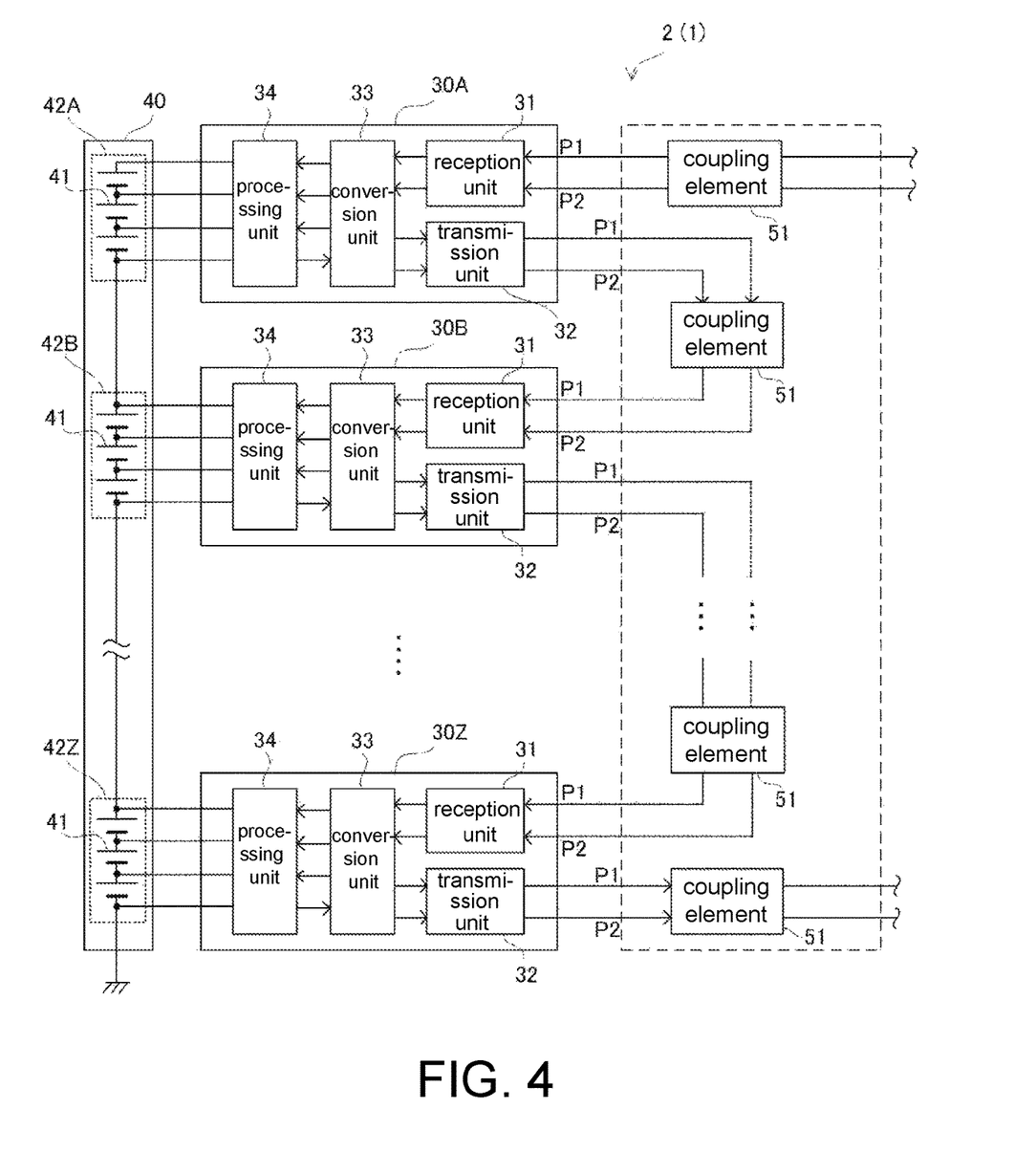
FIG. 4 is a diagram illustrating a configuration of a battery monitoring system according to an embodiment of the present invention.

FIG. 4 is a diagram illustrating a configuration of a battery monitoring system 2 according to an embodiment of the present invention in which a communication system 1 is used. The battery monitoring system 2 monitors a state of each battery cell 41 of an assembled battery 40 including a plurality of battery cells 41 connected in series. In FIG. 4, the control device 10 and the communication circuit 20 are not illustrated.

The plurality of battery cells 41 are grouped to form battery cell groups 42A, 42B, . . . , 42Z so that each of the battery cell groups include, for example, three different battery cells. The processing device 30A in the first stage is provided corresponding to the battery cell group 42A at the highest potential, and monitors a state of each of the battery cells 41 included in the battery cell group 42A. The processing device 30B is provided corresponding to the battery cell group 42B, and monitors a state of each of the battery cells 41 included in the battery cell group 42B. The processing device 30Z is provided corresponding to the battery cell group 42Z at the lowest potential and monitors the state of each of the battery cells 41 included in the battery cell group 42Z. Note that the number of battery cells 41 that are monitoring targets of the processing devices 30A to 30Z can be increased or decreased appropriately.

Figure 5:
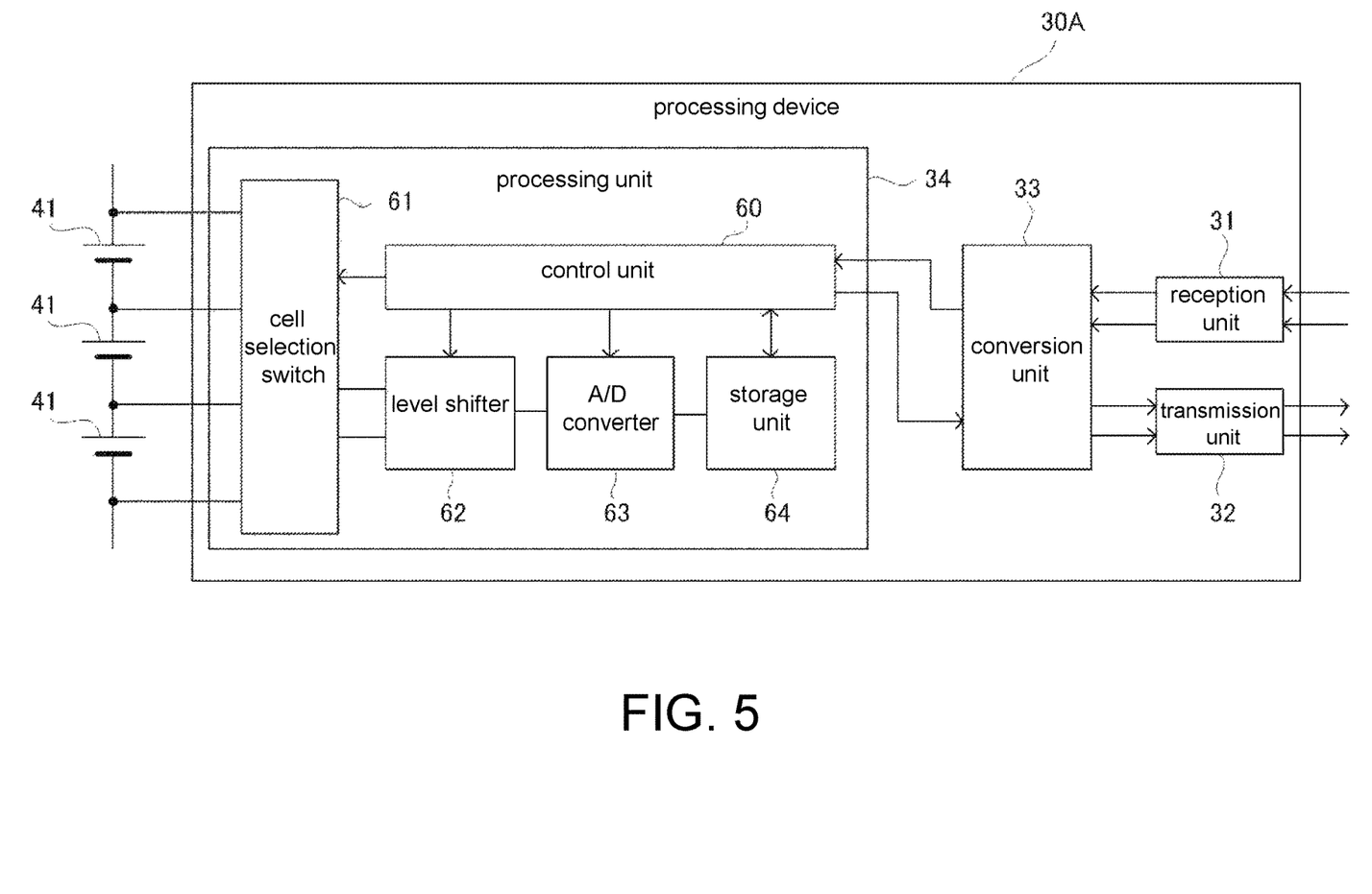
FIG. 5 is a block diagram illustrating an example of a configuration of a processing device according to an embodiment of the present invention.

FIG. 5 is a block diagram illustrating an example of a configuration of the processing device 30A. Configurations of the processing devices 30B to 30Z are also the same as that of the processing device 30A. In the processing device 30A, the processing unit 34 includes a control unit 60, a cell selection switch 61, a level shifter 62, an A/D converter 63, and a storage unit 64.

The cell selection switch 61 selects one of the battery cells 41 that are monitoring targets of the processing device according to the control signal supplied from the control unit 60 and outputs a voltage of each of a positive electrode and a negative electrode of the selected battery cell. The level shifter 62 outputs a cell voltage which is a difference between a positive electrode potential and a negative electrode potential of the battery cell 41 selected by the cell selection switch 61 at a level with reference to a ground potential. The A/D converter 63 outputs a digital value according to the cell voltage output from the level shifter 62. The storage unit 64 is a storage medium for storing the digital value of the cell voltage output from the A/D converter 63.

The control unit 60 controls the cell selection switch 61, the level shifter 62, the A/D converter 63, and the storage unit 64 according to the command included in the data signal MOSI obtained through the conversion process in the conversion unit 33.

Hereinafter, an operation when a command to instruct the processing device 30B to read the data of the cell voltage is issued from the control device 10 will be described by way of example. The command issued from the control device 10 is converted into a pulse signal by the communication circuit 20 (20A), and is supplied to the processing device 30A in the first stage via the transmission path 50. The command is transferred from the processing device 30A in the first stage to the processing device 30B in the subsequent stage, and transferred from the processing device 30B to the processing device in the subsequent stage. The command is sequentially transferred to the processing device 30Z in the last stage.

When the processing device 30B recognizes that the identification information such as the address or the ID included together with the command in the MOSI signal obtained through the conversion process in the conversion unit 33 designates the processing device 30B, the processing device 30B reads data of the cell voltage stored in the storage unit 64 of the processing device 30B, converts the read data into a pulse signal in the conversion unit 33, and then transmits the pulse signal from the transmission unit 32.

The read data read from the storage unit of the processing device 30B is sequentially transmitted to the processing devices in the subsequent stages and reaches the processing device 30Z in the last stage. The processing device 30Z in the last stage transmits the read data indicating the cell voltage read by the processing device 30B from the transmission unit 32 of the processing device 30Z. The read data transmitted from the transmission unit 32 of the processing device 30Z in the last stage is received by the pulse signal reception unit 23 of the communication circuit 20 (20A) via the transmission path 50. The conversion unit 21 of the communication circuit 20 (20A) converts a format of the received read data from a format of the pulse signal into a format of the serial signal (the SPI signal). The conversion unit 21 of the communication circuit 20 (20A) supplies the MISO signal including the read data obtained through the conversion process to the control device 10.

Note that although the case in which the processing devices 30A to 30Z measure the cell voltage of the battery cell 41 has been illustrated in the embodiment, the processing devices 30A to 30Z may measure a temperature of the battery cell 41.

In the communication circuits 20 and 20A according to the above embodiments, the serial signal reception unit 201 is an example of a first reception unit in the embodiment of the present invention. The first conversion unit 202 is an example of a first conversion unit in the embodiment of the present invention. The command determination unit 203 is an example of a signal output unit in the embodiment of the present invention. The selection unit 204 is an example of a selection unit in the embodiment of the present invention. The second conversion unit 205 is an example of a second conversion unit in the embodiment of the present invention. The pulse signal reception unit 23 is an example of a second reception unit in the embodiment of the present invention. The pulse signal transmission unit 22 is an example of the first transmission unit in the embodiment of the present invention. The serial signal transmission unit 206 is an example of a second transmission unit in the embodiment of the present invention. The comparison unit 207 is an example of a comparison unit in the embodiment of the present invention. The storage unit 208 is an example of a storage unit in the embodiment of the present invention.

What is claimed is:

1. A communication circuit, comprising:
    a first reception circuit that receives a first signal of a first signal format supplied from outside;
    a signal output circuit that outputs a second signal in the first signal format used for self-diagnosis when the first signal includes a specific command;
    a first conversion circuit to which any one of the first signal and the second signal is input, the first conversion circuit converting the input signal into a signal of a second signal format different from the first signal format, and outputting the signal as a third signal;
    a first transmission circuit that transmits the third signal to the outside;
    a second reception circuit that receives a fourth signal of the second signal format supplied from the outside;
    a selection circuit that selects the third signal from among the third signal and the fourth signal and outputs the third signal when the first signal includes the command, and selects the fourth signal from among the third signal and the fourth signal and outputs the fourth signal when the first signal does not include the command;
    a second conversion circuit that converts the third signal or the fourth signal output from the selection circuit into a signal of the first signal format and outputs the signal as a fifth signal; and
    a second transmission circuit that transmits the fifth signal to the outside.

2. The communication circuit according to claim 1, wherein the signal output circuit holds a plurality of signals of the first signal format used for self-diagnosis, and outputs any one of the plurality of held signals as the second signal according to the command.

3. The communication circuit according to claim 1, wherein the first signal format is a serial signal format used in a serial peripheral interface, and
    the second signal format is a pulse signal format including a first pulse sequence and a second pulse sequence.

4. A communication system comprising:
    the communication circuit according to claim 1; and
    a processing device that is communicatively connected to the communication circuit, and performs a predetermined process based on a signal transmitted from the first transmission circuit.

5. The communication system according to claim 4, further comprising a control device that is connected to the first reception circuit and the second transmission circuit, and supplies the first signal including the command to the first reception circuit.

6. The communication system according to claim 5, wherein the control device supplies a signal including identification information not corresponding to any of the processing devices to the communication circuit as the first signal including the command.

7. A communication system, comprising:
    the communication circuit according to claim 1; and
    a plurality of processing devices that perform a predetermined process based on a signal transmitted from the first transmission circuit,
    wherein one of the plurality of processing devices is connected to the first transmission circuit via a transmission path,
    another one of the plurality of processing devices is connected to the second reception circuit via the transmission path, and
    each of the plurality of processing devices is communicatively connected to another processing device among the plurality of processing devices.

8. The communication system according to claim 7, wherein each of the plurality of processing devices measures a cell voltage of a battery cell as the predetermined processing.

9. A communication circuit, comprising:
    a first reception circuit that receives a first signal of a first signal format supplied from outside;
    a first conversion circuit that converts the first signal into a signal of a second signal format different from the first signal format, and outputs the signal as a second signal;
    a first transmission circuit that transmits the second signal to the outside;
    a second reception circuit that receives a third signal of the second signal format supplied from the outside;
    a selection circuit that selects the second signal from among the second signal and the third signal and outputs the second signal when the first signal includes a specific command, and selects the third signal from among the second signal and the third signal and outputs the third signal when the first signal does not include the command;
    a second conversion circuit that converts the second signal or the third signal output from the selection circuit into a signal of the first signal format and outputs the signal as a fourth signal;
    a second transmission circuit that transmits the fourth signal to the outside; and
    a comparison circuit that compares the first signal with the fourth signal and outputs a comparison result.

10. The communication circuit according to claim 9, further comprising a storage unit that stores the comparison result in the comparison circuit.

11. The communication circuit according to claim 9 wherein the second transmission circuit stops transmission of the fourth signal to the outside according to the command.

12. A communication system comprising:
    the communication circuit according to claim 9; and
    a processing device that is communicatively connected to the communication circuit, and performs a predetermined process based on a signal transmitted from the first transmission circuit.

13. The communication system according to claim 12, further comprising a control device that is connected to the first reception circuit and the second transmission circuit, and supplies the first signal including the command to the first reception circuit.

14. The communication system according to claim 13, wherein the control device supplies a signal including identification information not corresponding to any of the processing devices to the communication circuit as the first signal including the command.

15. A communication system, comprising:
the communication circuit according to claim 9; and
a plurality of processing devices that perform a predetermined process based on a signal transmitted from the first transmission circuit,
wherein one of the plurality of processing devices is connected to the first transmission circuit via a transmission path,
another one of the plurality of processing devices is connected to the second reception circuit via the transmission path, and
each of the plurality of processing devices is communicatively connected to another processing device among the plurality of processing devices.

16. The communication system according to claim 15, wherein each of the plurality of processing devices measures a cell voltage of a battery cell as the predetermined processing.

17. The communication system according to claim 15, further comprising a control device that is connected to the first reception circuit and the second transmission circuit, and supplies the first signal including the command to the first reception circuit.

18. The communication system according to claim 17, wherein the control device supplies a signal including identification information not corresponding to any of the processing devices to the communication circuit as the first signal including the command.

19. A self-diagnosis method in a communication circuit comprising a first reception circuit that receives a first signal of a first signal format supplied from outside, a first conversion circuit that converts the first signal into a signal of a second signal format different from the first signal format and outputs the signal as a second signal, a first transmission circuit that transmits the second signal to the outside, a second reception circuit that receives a third signal of the second signal format supplied from the outside, a second conversion circuit that converts the third signal into a signal of the first signal format and outputs the signal as a fourth signal, and a second transmission circuit that transmits the fourth signal to the outside, the self-diagnosis method comprising:
supplying a signal for self-diagnosis of the first signal format to the first conversion circuit;
inputting a signal for self-diagnosis that is converted into the second signal format output from the first conversion circuit instead of the third signal to the second conversion circuit; and
transmitting a signal for self-diagnosis that is further converted into the first signal format output from the second conversion circuit to the outside via the second transmission circuit.

20. A self-diagnosis method in a communication circuit comprising a first reception circuit that receives a first signal of a first signal format supplied from the outside, a first conversion circuit that converts the first signal into a signal of a second signal format different from the first signal format and outputs the signal as a second signal, a first transmission circuit that transmits the second signal to the outside, a second reception circuit that receives a third signal of the second signal format supplied from the outside, a second conversion circuit that converts the third signal into a signal of the first signal format and outputs the signal as a fourth signal, and a second transmission circuit that transmits the fourth signal to the outside, the self-diagnosis method comprising:
inputting the second signal instead of the third signal to the second conversion circuit; and
comparing the signal output from the second conversion circuit to which the second signal is input with the first signal.

* * * * *